United States Patent [19]

Sei et al.

[11] Patent Number: 5,239,216
[45] Date of Patent: Aug. 24, 1993

[54] CLAMPING CIRCUIT FOR PREVENTING OUTPUT DRIVING TRANSISTOR FROM DEEP SATURATION STATE

[75] Inventors: Toshikazu Sei, Kawasaki; Yasunori Tanaka, Yokohama, both of Japan

[73] Assignee: Kabushiki Kaisha Toshiba, Kawasaki, Japan

[21] Appl. No.: 825,130

[22] Filed: Jan. 24, 1992

[30] Foreign Application Priority Data

Jan. 29, 1991 [JP] Japan .................. 3-26762
Oct. 24, 1991 [JP] Japan .................. 3-277507

[51] Int. Cl.$^5$ ........................... H03K 5/08; H03K 3/33
[52] U.S. Cl. ........................... 307/549; 307/540; 307/300; 307/315
[58] Field of Search ............ 307/300, 264, 540, 547, 307/546, 549, 567, 315, 415, 362, 317.2

[56] References Cited

U.S. PATENT DOCUMENTS

B530,285 4/1976 Sakamoto et al. .............. 307/300
3,160,765 12/1964 Krossa ........................... 307/300 X
3,473,047 10/1969 Bohn et al. .................... 307/300 X
3,676,713 7/1972 Wiedmann .................... 307/300 X
4,246,501 1/1981 Baker ............................ 307/300
4,583,051 4/1986 Bowers ......................... 307/300 X Primary Examiner—William L. Sikes
Assistant Examiner—Toan Tran
Attorney, Agent, or Firm—Finnegan, Henderson, Farabow, Garrett & Dunner

[57] ABSTRACT

A semiconductor integrated circuit includes a current source for supplying a current i, a resistor, a switch having a control end connected to the resistor, an output terminal connected to the output end of the switch, a comparator having a current path which is connected at one end to a connection node between the resistor and the control end of the switch and connected at the other end to the output terminal. The comparator compares a voltage ($i \times R$) occurring across the resistor with a potential V of the output terminal and permits the current i to flow into the output terminal when the relation ($i \times R \geq V$) is attained.

39 Claims, 14 Drawing Sheets

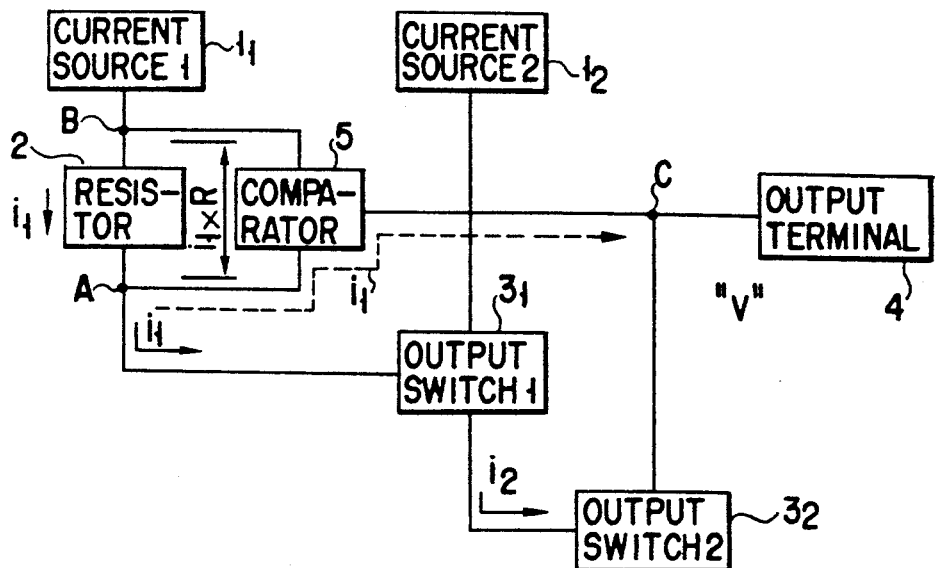
F I G. 7
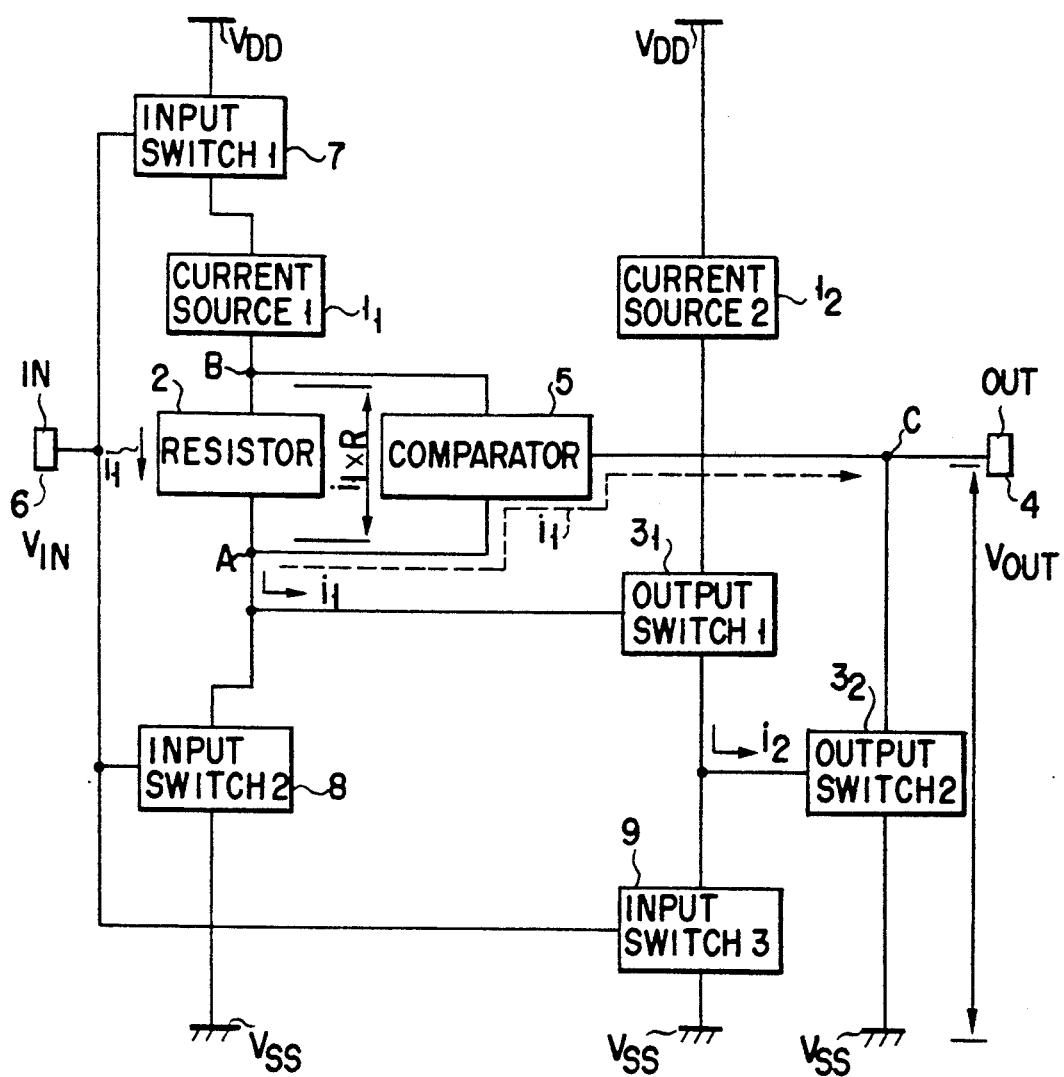
F I G. 8

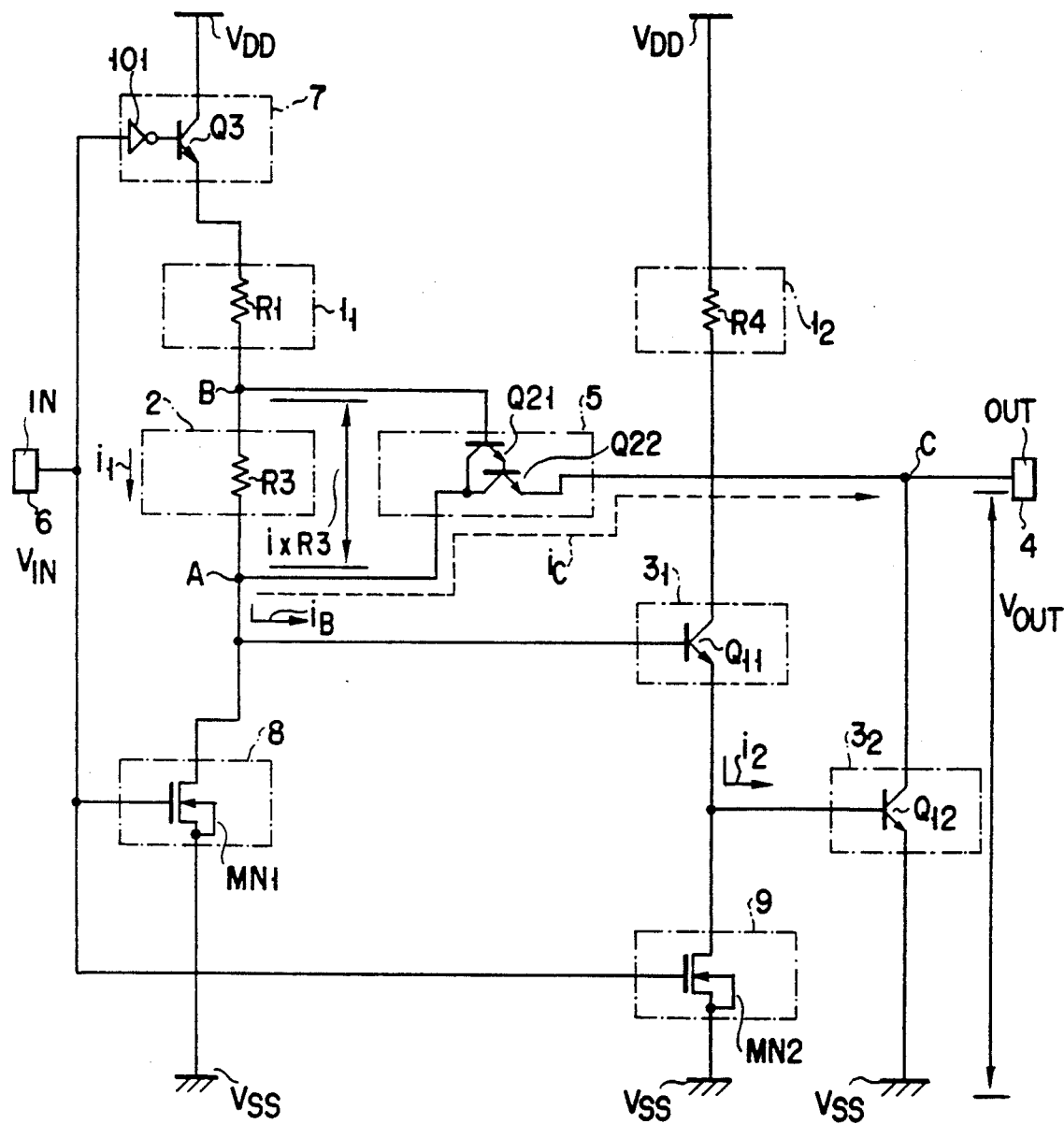
F I G. 9

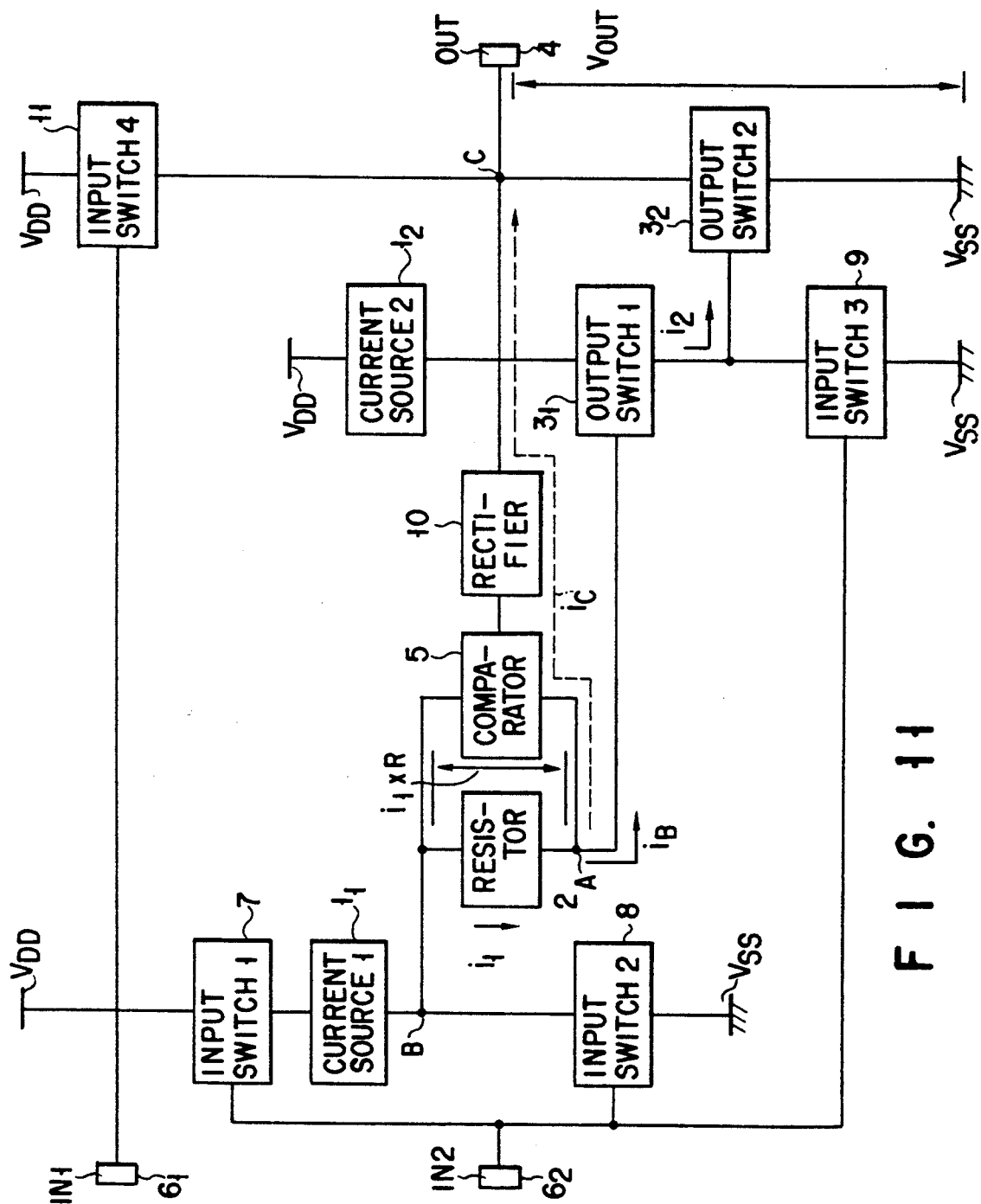
F I G. 11

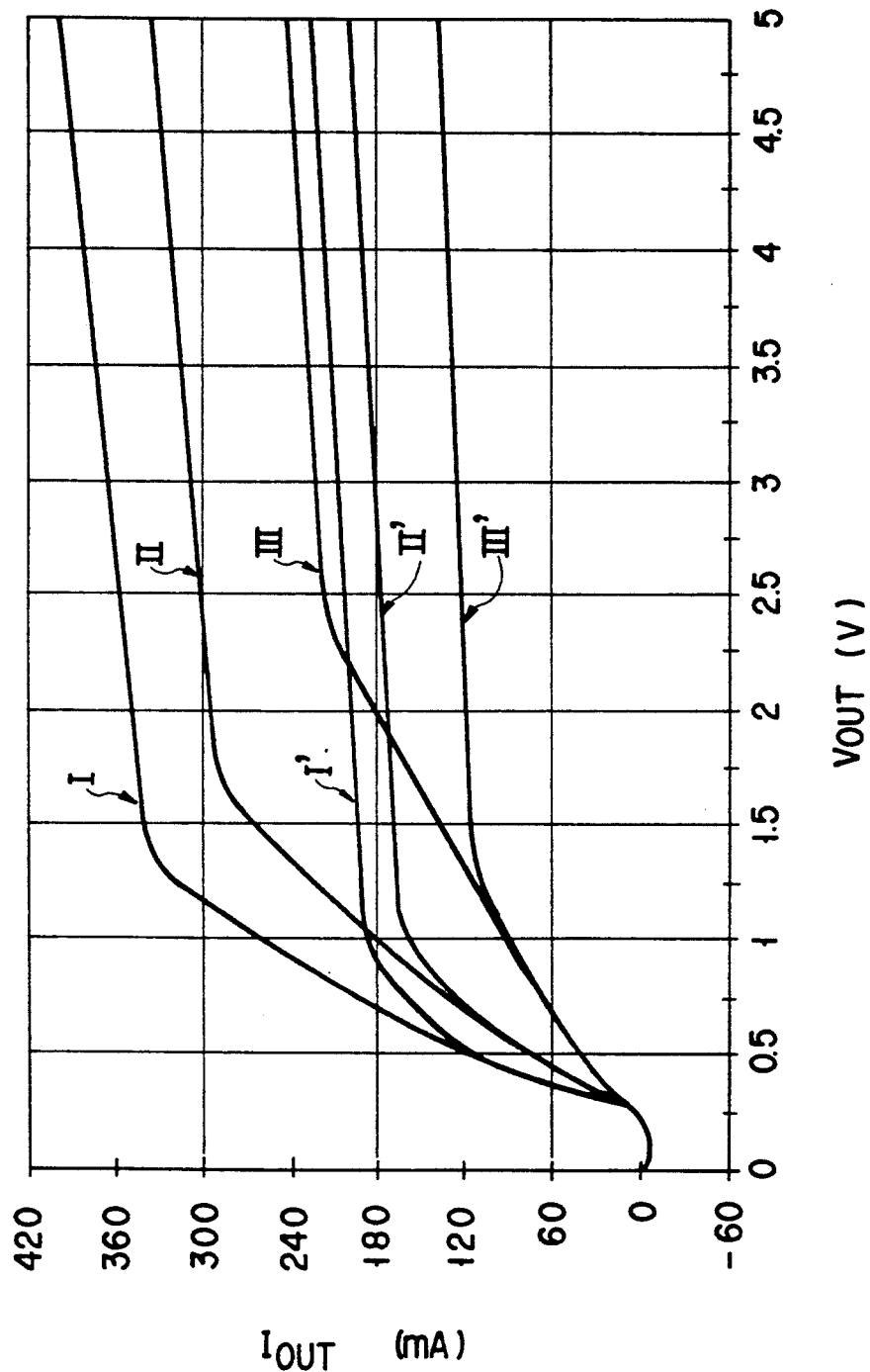
F I G. 14

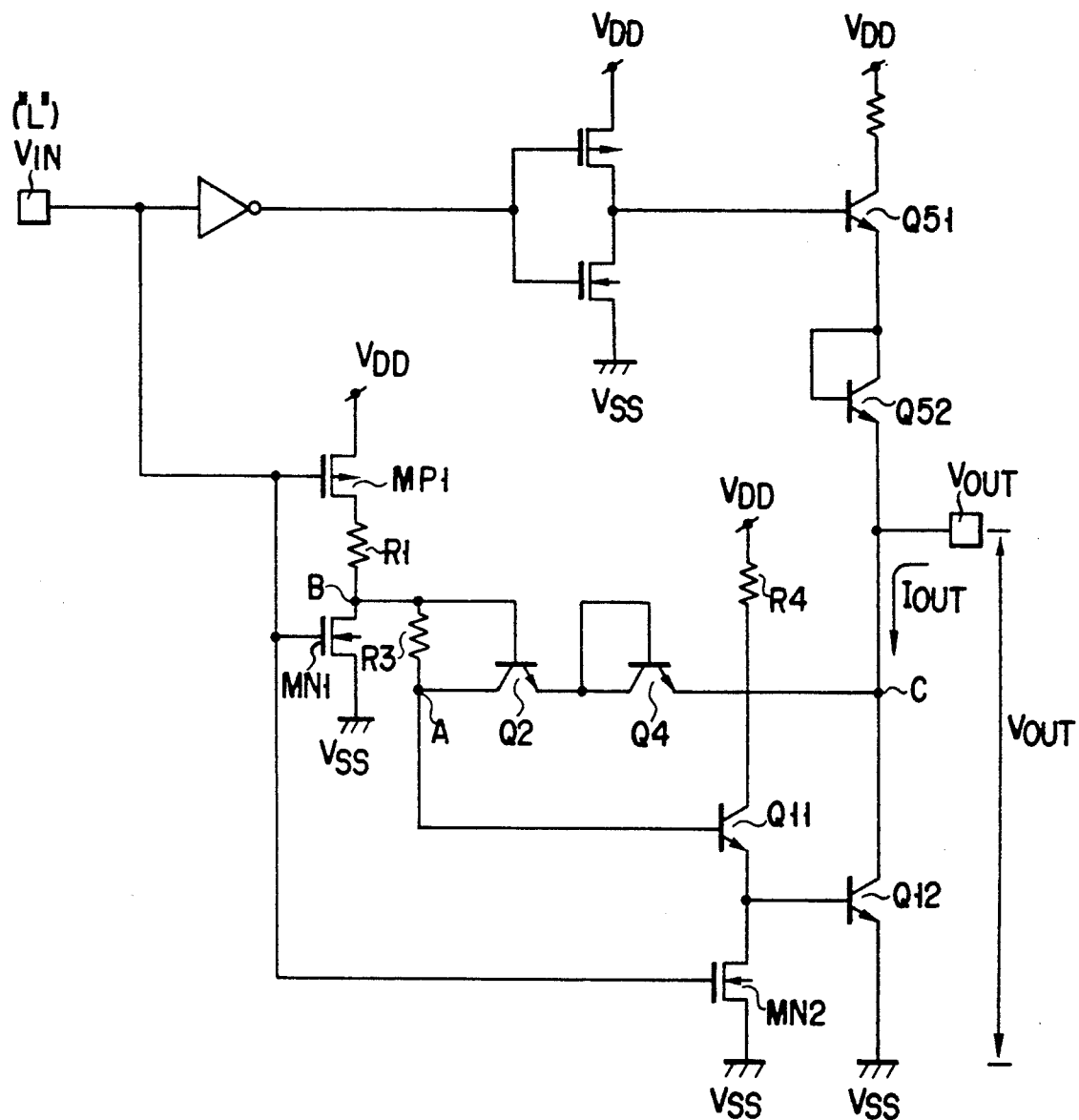
F I G. 15

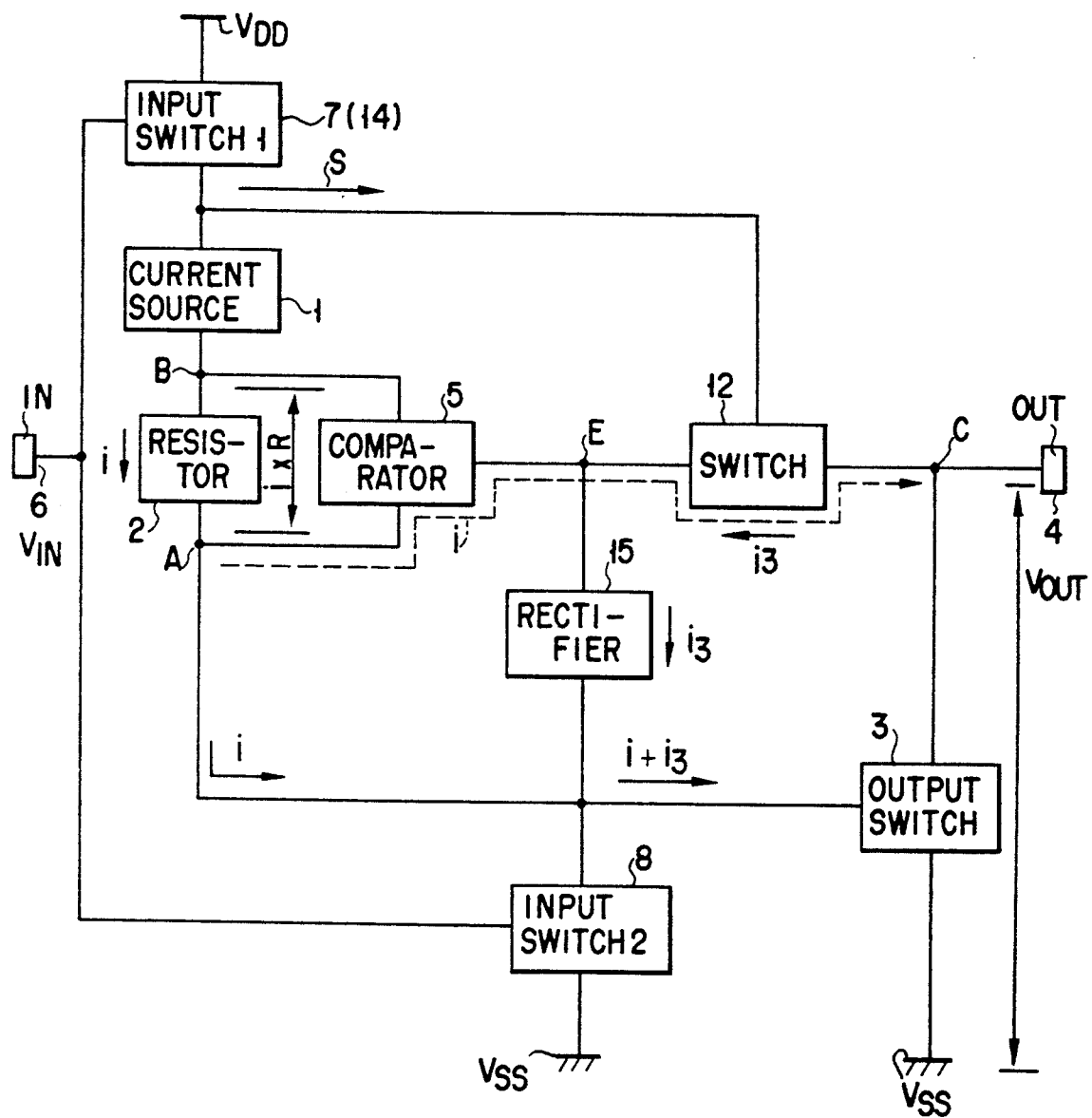
F I G. 18

CLAMPING CIRCUIT FOR PREVENTING OUTPUT DRIVING TRANSISTOR FROM DEEP SATURATION STATE

BACKGROUND OF THE INVENTION

1. Field of the Invention

This invention relates to a clamping circuit, and more particularly to a clamping circuit for preventing occurrence of the deep saturation state of an output driving transistor provided in an output driving circuit.

2. Description of the Related Art

Conventionally, a Schottky barrier diode SBD having an anode connected to the base B of an output driving transistor Q1 shown in FIG. 1 and a cathode connected to the collector C thereof is used as a clamping circuit for preventing occurrence of the deep saturation state of the output driving transistor.

The clamping circuit is activated when the collector voltage or the output voltage (output signal) $V_{OUT}$ is set to satisfy the following expression.

$$V_{OUT} < V_{BE} - V_{FD1}$$

where $V_{OUT}$ is the output voltage, $V_{BE}$ is a voltage between the base and emitter of a transistor Q100 and $V_{FD1}$ is the threshold voltage of the diode SBD.

When the clamping circuit is activated, the base current $i_B$ of the transistor Q100 decreases and part of the current $i_B$ which has flowed into the base B is caused to flow into the collector C via the SBD. As a result, the transistor Q100 can be prevented from being set into the deep saturation state.

Unless the clamping circuit is used, the base current $i_B$ is kept unchanged even when the output voltage $V_{OUT}$ becomes lower, and the base-emitter junction and the base-collector junction are biased in a forward direction. Even if the base current $i_B$ is interrupted in this state, it takes a long time for minority carriers accumulated in the base B to disappear. As a result, the transition time of the output from the "L" level to the "H" level becomes long.

However, since the SBD is used in the above clamping circuit, there occurs a problem that the manufacturing process becomes complicated, for example. Particularly, in the case of a gate array using the master slice method, it is necessary to form the SBD of the clamping circuit on the master slice in order to constitute the clamping circuit having the SBD. However, the area for the SBD becomes useless in an area of transistors (basic cells) which are not used for constituting the output driver.

In order to solve the above problem, it is considered to use a circuit including a silicon bipolar transistor Q102 having the base B and the collector C connected together in the clamping circuit a shown in FIG. 2.

In this case, since $V_{BE}$ of the output driving transistor Q100 and the threshold voltage $V_{FD2}$ of the base-emitter junction of the transistor Q102 are equal to each other, a resistor R2 is connected at one end to the base B of the transistor Q100 and connected at the other end to the base B and the collector C of the transistor Q102.

This type of clamping circuit is activated when the collector voltage or the output voltage (output signal) $V_{OUT}$ satisfies the following expression.

$$V_{OUT} < V_{BE} + i_B \times R2 - V_{FD2} = i_B \times R2$$

where $V_{OUT}$ is the output voltage, $V_{BE}$ is a voltage between the base and emitter of the transistor Q100, $i_B$ is the base current, R2 is the resistance of the resistor and $V_{FD2}$ is the threshold voltage of the base emitter junction of the transistor Q102.

The clamping circuit is activated after the $V_{OUT}$ becomes lower than $i_B$ R2. Therefore, the base current $i_B$ can be decreased.

However, when the base current $i_B$ is decreased, the voltage drop across the resistor R2 becomes smaller to reduce the current flowing in the base-emitter junction of the transistor Q102. As a result, it becomes difficult to abruptly increase the current flowing in the base-emitter junction of the transistor Q102 or reduce the base current $i_B$ after the output voltage $V_{OUT}$ has reached a preset level.

When the SBD is used, the voltage-current characteristic of the clamping circuit can be so determined that a current can be caused to more easily flow in comparison with a case of use of the PN junction by adequately selecting metal material constituting one of the electrodes of the SBD. However, when the base-emitter junction of the silicon transistor is used, current does not easily flow into the PN junction and reduction in the base current $i_B$ becomes dull in comparison with a case of using an SBD.

This problem may be solved by increasing the resistance of the resistor R2 and activating the clamping circuit when the output voltage $V_{OUT}$ is sufficiently large. However, at this time, it becomes difficult to realize the DC characteristic required for the output driver circuit.

SUMMARY OF THE INVENTION

An object of this invention is to provide a clamping circuit which permits a current to stably flow into an output terminal without using an SBD.

The above object can be attained by a semiconductor integrated circuit comprising a current source for supplying a current i; a resistor; a switch connected at a control end to the resistor; an output terminal connected to the output end of the switch; and a comparator having a current path connected at one end to a connection node between the resistor and the control end of the switch and connected at the other end to the output terminal. The comparator compares a voltage (i×R) occurring across the resistor with a potential V of the output terminal and permits the current i to flow into the output terminal when the relation i×R≧V is attained.

In this invention, since one end of the current path of the comparator is connected to the connection node between the resistor and the input end of the switch so as to permit the current flowing in the resistor to flow into the output terminal, the current can be stably supplied to the output terminal irrespective of variation in the voltage drop across the resistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a block diagram of a clamping circuit according to a second embodiment of this invention;

FIG. 8 is a block diagram of an output driver circuit having the clamping circuit of FIG. 7 incorporated therein;

FIG. 9 is a circuit diagram of the output driver circuit shown in FIG. 8;

FIG. 11 is a block diagram of an output driver circuit having the clamping circuit of FIG. 10 incorporated therein

FIG. 14 is an output characteristic diagram showing the relationship between the output current and the voltage when a current from a second current source is changed;

FIG. 15 is a circuit diagram of an output driver circuit used for checking the characteristic shown in FIG. 14;

FIG. 18 is a block diagram of an output driver circuit having the clamping circuit of FIG. 17 incorporated therein;

DETAILED DESCRIPTION OF THE PREFERRED EMBODIMENTS

Figure 1:
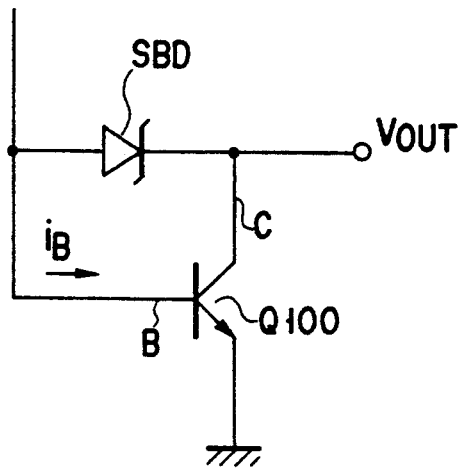
FIG. 1 is a circuit diagram of the prior art clamping circuit.

There will now be described an embodiment of this invention with reference to the accompanying drawings. In this description, portions which are the same in the accompanying drawings are denoted by the same reference numerals and the repetitive explanation is omitted.

Figure 3:
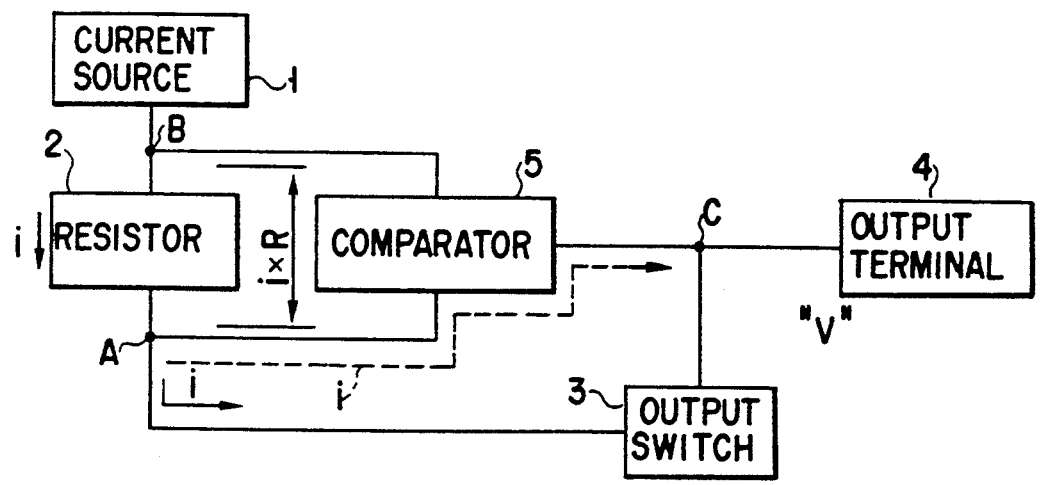
FIG. 3 is a block diagram of a clamping circuit according to a first embodiment of this invention.

FIG. 3 is a block diagram of a clamping circuit according to a first embodiment of this invention.

As shown in FIG. 3, a current source 1 is connected to a resistor 2 and the resistor 2 is connected to an input end of an output switch 3. An output end of the output switch 3 is connected to an output terminal 4. An input of a comparator 5 is connected to a node B between the current source 1 and the resistor 2. The comparator 5 has a current path connected at one end to a node A between the resistor 2 and the output switch 3 and connected at the other end to a node C between the output switch 3 and the output terminal 4.

Next, the operation of the above clamping circuit will be explained. The power source 1 generates a current i to be supplied to the resistor 2. The current i is supplied to the output switch 3 to turn on the switch 3. When the output switch 3 is turned on, an output voltage V is permitted to be applied to the output terminal 4. The comparator 5 detects the voltage (i×R) across the resistor 2 and compares the voltage (i×R) with the output potential V. The comparator 5 causes the current i flowing in the resistor 2 to be supplied to the output terminal 4 when the output potential V and the voltage (i×R) are set to satisfy the following expression.

$$i \times R \geq V$$

where R is the resistance of the resistor 2.

The comparator 5 has the above function and can cause the current i flowing in the resistor 2 to be supplied to the output terminal 4 via the output switch 3 when the output potential V becomes lower than the voltage (i×R).

The above function can be stably attained, irrespective of the magnitude of the current i flowing the resistor 2 during a period in which the above expression is satisfied.

In the clamping circuit, the output switch 3 will not be in deep saturation state, despite the reduction in the current flowing from the node C to the output switch 3.

Figure 4:
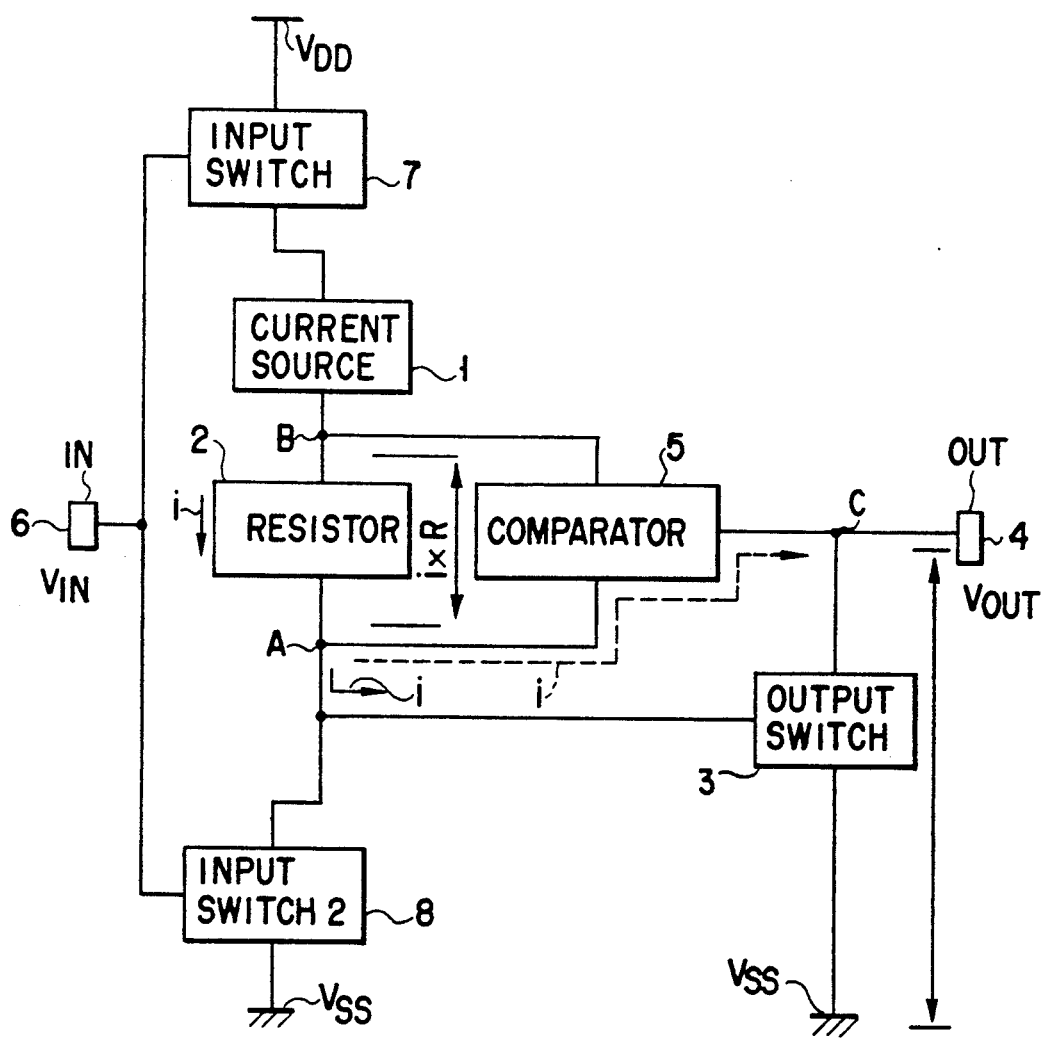
FIG. 4 is a block diagram of an output driver circuit having the clamping circuit of FIG. 3 incorporated therein.

FIG. 4 is a block diagram of an output driver circuit having a clamping circuit of FIG. 3 incorporated therein.

As shown in FIG. 4, a first input switch 7 is connected between the current source 1 and a high potential power source $V_{DD}$. A second input switch 8 is connected between a low potential power source $V_{SS}$ and the node A between the resistor 2 and the output switch 3. The control end of the first input switch 7 and the control end of the second input switch 8 are connected to an input terminal 6. The first input switch 7 and the second input switch 8 have the following relation. That is, the second input switch 8 is set in the OFF state when the first input switch 7 is set in the ON state, and the second input switch B is set in the ON state when the first input switch 7 is set in the OFF state.

The operation of the above clamping circuit will be explained.

Assume that the first input switch 7 is set in the ON state when the input voltage (input signal) $V_{IN}$ is set at the "L" level.

First, when the first switch 7 is turned on, the current source 1 supplies a current to the resistor 2. Thus, the current i flows in the resistor 2 and is supplied to the control end of the output switch 3 to turn on the switch 3. When the output switch 3 is turned on, a voltage of "L" level is output to the output terminal 4 as an output voltage (output signal) $V_{OUT}$.

The comparator 5 compares the output voltage $V_{OUT}$ with the voltage ($i \times R$) across the resistor 2. When expression "$V_{OUT} \leq i \times R$" is satisfied, the current i is caused to flow into the output terminal 4 through the comparator 5. Thus, the output switch 3 can be prevented from being set into the deep saturation state.

When the input voltage (input signal) $V_{IN}$ is at the "H" level, the output voltage VOUT is set to the high impedance state.

Figure 5:
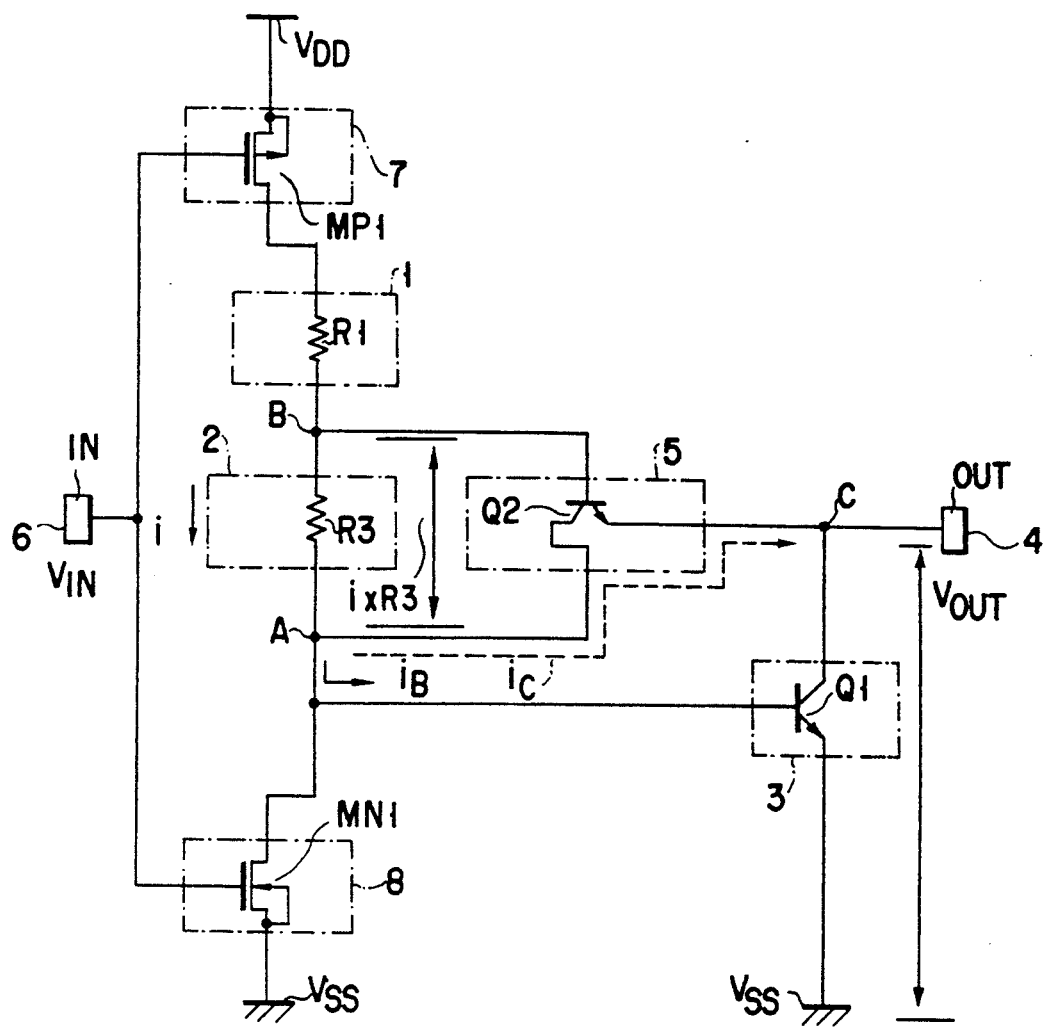
FIG. 5 is a circuit diagram of the output driver circuit shown in FIG. 4.

FIG. 5 is a circuit diagram of the output driver circuit 10 of FIG. 4.

As shown in FIG. 5, the source of a P-channel MOSFET (which is hereinafter referred to as a PMOS) MP1 is connected to the high potential power source $V_{DD}$ and the drain thereof is connected to one end of a resistor R1 serving as a passive element. The other end of the resistor R1 is connected to one end of a resistor R3 which is a passive element. The other end of the resistor R3 is connected to the drain of an N-channel MOSFET (which is hereinafter referred to as an NMOS) MN1 whose source is connected to the low potential power source $V_{SS}$. The gate of the PMOS MP1 and the gate of the NMOS MN1 are connected to the input terminal 6. The input terminal 6 is applied with an input voltage (input signal) $V_{IN}$. The node A between the resistor R3 and the NMOS MN1 is connected to the base of an NPN bipolar transistor Q1 for the output driver. The emitter of the transistor Q1 is connected to the power source $V_{SS}$, and the collector thereof is connected to the output terminal 4. The collector of a bipolar transistor Q2 is connected to the node A, the base thereof is connected to the node B between the resistors R1 and R3 and the emitter thereof is connected to the node C between the collector of the transistor Q1 and the output terminal 4.

Next, the operation of the above circuit will be explained.

When an input voltage $V_{IN}$ is set at the "L" level, the PMOS is set in the ON state so as to permit the current $i_B$ (base current) to be supplied to the base of the transistor Q1, thereby pulling down the potential of the output terminal 4 and outputting an output voltage $V_{OUT}$ of "L" level. At this time, the potential $V_{BE1}$ of the node A is equal to the forward voltage drop $V_F$ of the base-emitter junction of the transistor Q1. The potential of the node B is set to "$V_{BE2}+V_{OUT}=V_{BE1}+i \times R3$" (the potential of $V_{OUT}$ is set at the "H" level in the initial period and R3 is the resistance of the resistor R3). The transistor Q2 is set in the OFF state while the output voltage $V_{OUT}$ is set at the "H" level and "$V_{BE2}<V_F$" is satisfied. In this state, all the current supplied from the PMOS MP1 is caused to flow into the base of the transistor Q1, thus enhancing the driving ability of the transistor Q1. When the transistor Q1 is operated, the output voltage $V_{OUT}$ starts to be lowered. Then, the potential of the node B is set to "$V_{BE2}=V_F$" and the transistor Q2 is turned on when "$V_{OUT}=i \times R3$" is achieved. At this time, the current becomes equal to the sum of the collector current $i_C$ of the transistor Q2 and the base current $i_B$ of the transistor Q1. The base current $i_B$ of the transistor Q2 is small in comparison with the base current $i_B$ and the potential of the node A will be changed only by a small amount. (The base current $i_B$ of the transistor Q1 is a fraction of the product of the grounded emitter current amplification factor $h_{FE}$ ($h_{FE}$ is 100, for example) and the base current $i_B$.) As a result, the potential of the node B may be changed only by a slight amount.

When the output voltage $V_{OUT}$ is further lowered and "$V_{BE2}$" is achieved, the base current $i_B$ flowing into the base of the transistor Q2 further increases and the collector current also $i_C$ increases so that the base current $i_B$ of the transistor Q1 may be further decreased. All the current flowing via the collector-emitter path of the transistor Q2 flows into the collector of the transistor Q1.

Thus, the transistor Q1 is prevented from assuming deep saturation state, because the base current $i_B$ of the transistor Q1 is reduced, and also because a collector current corresponding to the current $i_C$ is supplied to the transistor Q1.

The resistor R1 and R3 are of the same structure and have been simultaneously manufactured by the same process. Hence, their resistances are different from the respective design values, by substantially the same amount. If the resistance of the resistor R3 is lower than the design value, and that of the resistor R1 is equally lower than its design value, and more current flows through the resistor R1, whereby the voltage drop in the resistor R3 remains particularly unchanged. If the resistance of the resistor R3 is conversely higher than the design value, and that of the resistor R1 is equally higher than its design value, and less current flows through the resistor R1, whereby the voltage drop in the resistor R3 remains practically unchanged. The ratio of the resistance of the resistor R1 to that of the resistor R3 (i.e., R1/R3), is, therefore, substantially equal to the design value. This is another advantage of the present invention.

The less the deviation of the potential difference between the ends of the resistor R3 from the design value, the better. Since the ratio of R1/R3 is substantially equal to the design value, the deviation of the resistances of the resistor R3 from its design value is canceled by the deviation of the resistance of the resistor R1 from its design value. Hence, the potential difference between the ends of the resistor R3 deviates, but very little, from the design value.

Figure 6:
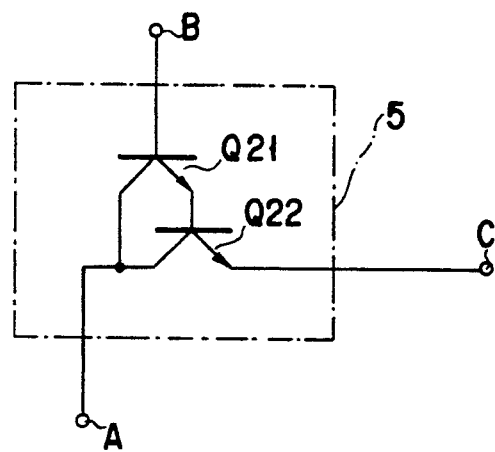
FIG. 6 is a circuit diagram showing another example of a comparator shown in FIG. 5.

FIG. 6 is a circuit diagram showing another example of a circuit of the comparator 5.

As shown in FIG. 6, the base of a transistor Q21 is connected to the node B and the collector thereof is connected to the collector of a transistor Q22 and the node A. The base of the transistor Q22 is connected to the emitter of the transistor Q21 and the emitter thereof is connected to the node C.

Thus, the comparator 5 may be formed of a circuit having two transistors connected in a "Darlington circuit configuration".

With the above construction, a current larger than that in the comparator 5 of FIG. 5 can be supplied to the output terminal 4.

FIG. 7 is a block diagram of a clamping circuit according to a second embodiment of this invention.

As shown in FIG. 7, a resistor 2 is connected between a first current source $1_1$ and the control end of a first output switch $3_1$. The current path of the first output switch $3_1$ is connected at one end to a second current source $1_2$ and connected at the other end to the control end of a second output switch $3_2$. The output end of the second output switch $3_2$ is connected to the output terminal 4.

Next, the operation of the above clamping circuit will be explained.

The first current source $1_1$ creates a current i1 to be supplied to the resistor 2. The current i1 is supplied to the first output switch $3_1$ to turn on the first output switch $3_1$. The second current source 12 creates a current i2 to be supplied to the control end of the second output switch $3_2$. When the first output switch $3_1$ is turned on, the second current source $1_2$ and the second output switch $3_2$ are electrically connected to each other. The second output switch $3_2$ is turned on when supplied with the current i2.

With the above construction, the current driving ability of the output switches in the clamping circuit can be enhanced.

FIG. 8 is a block diagram of an output driver circuit having the clamping circuit of FIG. 7 incorporated therein.

As shown in FIG. 8, a third input switch 9 is connected to the control end of the second output switch $3_2$. Like a second input switch 8, the third switch 9 is turned off or on when a first input switch 7 is turned on or off, respectively.

Next, the operation of the above circuit will be explained.

Assume that the first input switch 7 is turned on when an input voltage (input signal) $V_{IN}$ is set at the "L" level.

First, when the first input switch 7 is turned on, the first current source $1_1$ supplies a current to the resistor 2. As a result, the current i1 flows in the resistor 2 and is then supplied to the control end of the first output switch $3_1$. As a result, the first output switch $3_1$ is turned on. When the first output switch $3_1$ is turned on, a current i2 is supplied to the control end of the second output switch $3_2$ from the second current source $1_2$. As a result, the second output switch $3_2$ is turned on and a voltage of "L" level is output as an output voltage (output signal) $V_{OUT}$ from the output terminal 4.

The comparator 5 compares the output voltage $V_{OUT}$ with a voltage (i1×R) across the resistor 2. When the relation "$V_{OUT} \leq i1 \times R$" is obtained, the comparator 5 causes the current i1 to flow into the output terminal 4 instead of passing the current through the output switch $3_1$. Thus, the second output switch $3_2$ can be prevented from being set into the deep saturation state.

Further, when the input voltage (input signal) $V_{IN}$ is set at the "H" level, the output voltage $V_{OUT}$ is set to the high impedance state.

FIG. 9 is a circuit diagram of the output driver circuit of FIG. 8.

As shown in FIG. 9, the second current source $1_2$ is constituted by a resistor R4 which is a passive element. The resistor R4 is connected at one end to the power source $V_{DD}$ and connected at the other end to the collector of a transistor Q11. The base of the transistor Q11 is connected to a node A and the emitter thereof is connected to the base of a transistor Q12 and the drain of an NMOS MN2. The source of the NMOS MN2 is connected to the power source $V_{SS}$. The emitter of the transistor Q12 is connected to the power source $V_{SS}$ and the collector thereof is connected to the output terminal 4.

Further, the comparator 5 is constituted by the circuit shown in FIG. 6.

Next, the operation of the above circuit will be explained.

When the input voltage $V_{IN}$ is at the "L" level, the input voltage is inverted to the "H" level by means of the inverter 101, thereby turning on the transistor Q3. In this case, the NMOSs MN1 and MN2 are both turned off. When the transistor Q3 is turned on, a base current is sequentially supplied to the transistors Q11 and Q12, thereby pulling down the potential of the output terminal 4 to output an output voltage $V_{OUT}$ of "L" level. At this time, the potential of the node A is set to "$V_{BE11} + V_{BE12} = 2V_F$" and the potential of the node B is set to "$2V_F + i \times R3$". The comparator 5 is not activated until the expression ($V_{OUT} \leq i \times R3$) can be satisfied. Since the current supplied from the transistor Q3 is amplified by the transistor Q11 and then supplied to the base of the transistor Q12, the driving ability ca be enhanced in comparison with that of the circuit shown in FIG. 5.

When the output voltage $V_{OUT}$ is further lowered and the expression ($V_{OUT} \leq i \times R3$) is satisfied, most of the current supplied from the transistor Q3 flows into the collector of the transistor Q12 via the transistors Q21 and Q22. As in the circuit of FIG. 5, the base current $i_{B1}$ of the transistor Q11 is small, and therefore, even if it is amplified by the transistor Q11, a base current $i_{B2}$ supplied to the transistor Q12 is small, making it possible to prevent occurrence of the deep saturation state of the transistor Q12.

Figure 10:
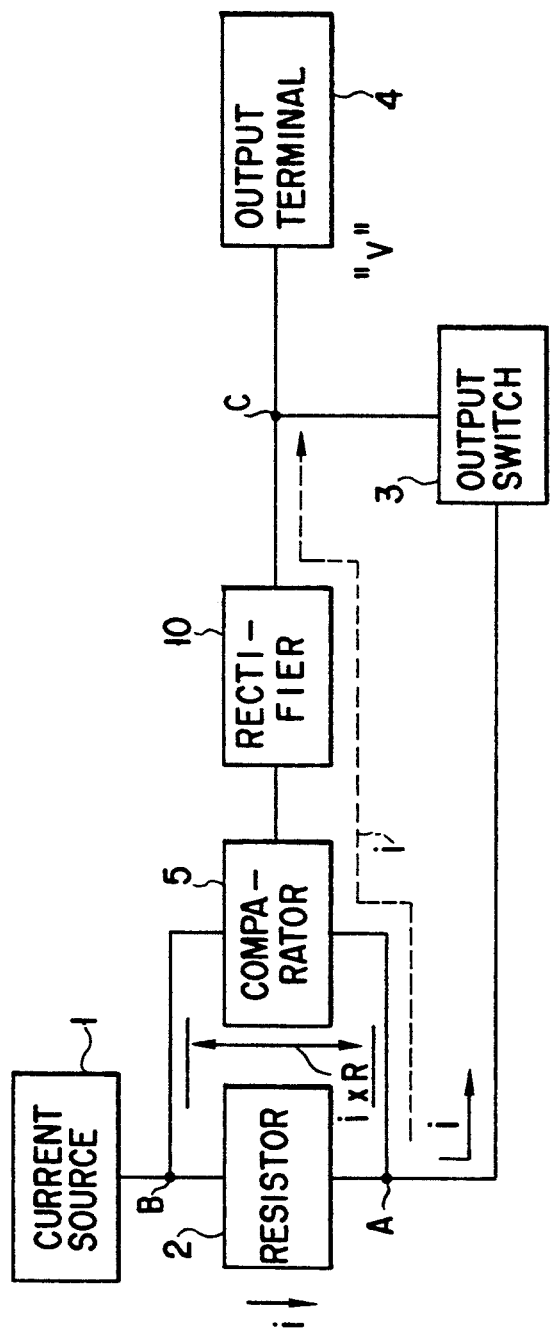
FIG. 10 is a block diagram of a clamping circuit according to a third embodiment of this invention.

FIG. 10 is a block diagram of a clamping circuit according to a third embodiment of this invention.

As shown in FIG. 10, the clamping circuit according to the third embodiment includes a rectifier 10 which is connected between a comparator 5 and an output terminal 4 to permit a current to flow only from the comparator 5 to the output terminal 4.

Since the rectifier 10 is connected between the comparator 5 and the output terminal 4, in the clamping circuit of FIG. 10, a reverse bias voltage which may be applied to the comparator 5 when the potential of the output terminal 4 becomes higher than the potential of the output end of the comparator 5 can be alleviated.

FIG. 11 is a block diagram of an output driver circuit having the clamping circuit of FIG. 10 incorporated therein.

As shown in FIG. 11, a forth input switch 11 may be connected between the output terminal 4 and the power source $V_{DD}$. When the fourth input switch 11 and the first input switch 7 are turned on, the output voltage VOUT is set to the high impedance.

Figures 12, 13:
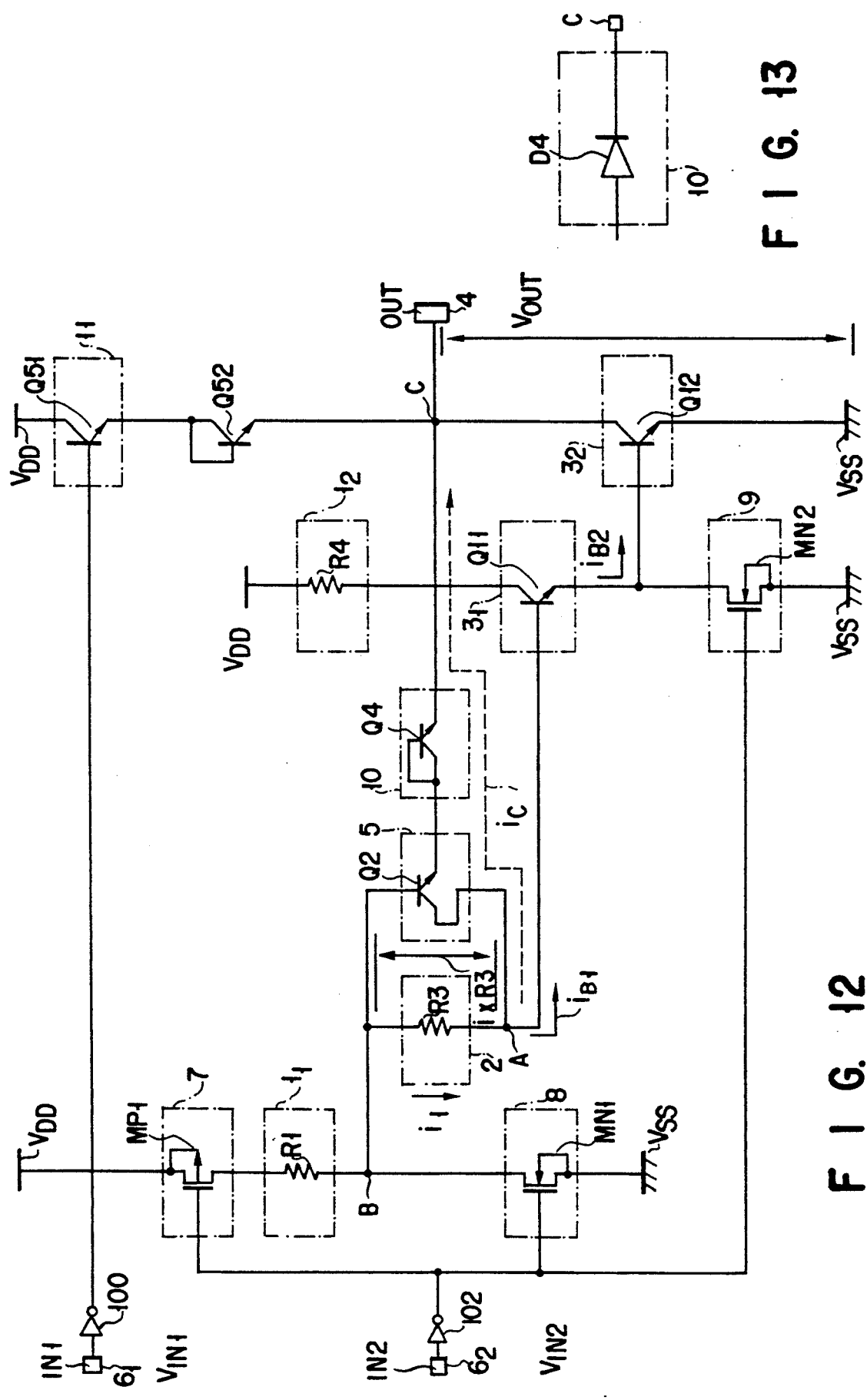
FIG. 12 is a circuit diagram of the output driver circuit shown in FIG. 11.
FIG. 13 is a circuit diagram showing another example of a rectifier shown in FIG. 11.

FIG. 12 is a circuit diagram of the output driver circuit of FIG. 11.

As shown in FIG. 12, the source of a PMOS MP1 having a gate supplied with an input signal $V_{IN2}$ is connected to the power source $V_{DD}$ and the drain thereof is connected to the drain of an NMOS MN1 via a resistor R1. The gate of the NMOS MN1 is supplied with an input signal $V_{IN2}$ and the source thereof is connected to the power source $V_{SS}$. A node B between the resistor R1 and the NMOS MN1 is connected to one end of a resistor R3 and the base of a clamping transistor Q2. The other end of the resistor R3 is connected to a node A between the base of a transistor Q11 and the collector of the transistor Q2. The collector of the transistor Q11 is connected to the high potential side power source $V_{DD}$ via a resistor R4 and the emitter thereof is connected to the base of the output transistor Q12 and to the low potential side power source $V_{SS}$ via the drain-source path of an NMOS MN2 whose gate is supplied with the input signal $V_{IN2}$. The emitter of a transistor Q12 is connected to the power source $V_{SS}$ and the collector thereof is connected to the emitter of an NPN transistor Q52. The base and collector of the transistor Q52 are connected together and to the emitter of an NPN transistor Q51 whose base is supplied with an input signal $V_{IN1}$. The collector of the transistor Q51 is connected to the power source $V_{DD}$. The emitter of the transistor Q12 is connected to the collector of a transistor Q4 having the collector and base connected together. The emitter of the transistor Q4 is connected to a node C between the emitter of the transistor Q52 and the collector of the transistor Q12 and the node C is connected to an output terminal 4 from which an output signal $V_{OUT}$ is output.

Next, the operation of the above circuit will be explained.

When the input signals $V_{IN1}$ and $V_{IN2}$ are both set at the "L" level, the signals $V_{IN1}$ and $V_{IN2}$ are inverted by inverters 100 and 102, and therefore, the transistor Q51 is turned on and the NMOS MN1 and PMOS MP1 are respectively turned on and off, thus setting the potential of the node B to the $V_{SS}$ level (ground potential level, for example). As a result, the transistor Q11 is turned off, the NMOS MN2 is turned on, and the transistor Q12 is turned off. Further, since the transistor Q51 is turned on, the potential of the node C is set to the "H" level. At this time, a reverse bias voltage is applied to the emitter-base junction of the clamping transistor Q2.

However, in the clamping circuit according to the third embodiment, since the diode-connected transistor Q4 is connected between the emitter of the transistor Q2 and the node C, the above reverse bias voltage can be reduced to one half that which is applied to the same when the transistor Q4 is not connected in a case where the transistor Q4 is formed with the same size as the transistor Q2.

According to the clamping circuit of the third embodiment, the reverse bias voltage applied to the base-emitter junction of the clamping transistor Q2 can be reduced by connecting the diode between the output terminal and the emitter of the transistor Q2. Therefore, in the semiconductor device of this invention, for example, a signal of a level range which is approximately twice that of the withstanding voltage between the base and emitter except the margin can be switched.

FIG. 13 is a circuit diagram showing another example of a circuit of the rectifier 10.

As shown in FIG. 13, the rectifier 10 is constructed by a diode D4 formed of a diffused PN junction. The anode of the diode D4 is connected to the emitter of the transistor Q2 shown in FIG. 12 and the cathode thereof is connected to the node C.

With the above construction, the same effect as that of the clamping circuit shown in FIG. 12 can be attained.

In the devices shown in FIGS. 7, 8, 9, 11 and 12, the output characteristic of the second output switch $3_2$ can be variously changed by changing the current value created by the second current source $1_2$. A method of changing the current value can be attained as follows, for example.

If the second current source $1_2$ is the resistor R4, the resistance of the resistor R4 is changed. Since the base current $i_{B2}$ is changed according to variation in the resistance of the resistor R4, an amount of saturation current $I_{OUT}$ flowing in the collector-emitter path of the transistor Q12 is changed. As a result, the output voltage (output signal) $V_{OUT}$ can be controlled to a desired value.

FIG. 14 is a characteristic diagram showing the relation between the saturation current $I_{OUT}$ of the transistor Q12 and the output voltage $V_{OUT}$. FIG. 15 is a circuit diagram of an output driver circuit used for measurement of the above characteristic.

As shown in FIG. 14, lines I and I' indicate cases wherein a specific current is 64 mA. When the resistance of the resistor R4 is 400 Ω, the relation between the saturation current $I_{OUT}$ and the output voltage $V_{OUT}$ as indicated by the line I is obtained. When the resistance of the resistor R4 is changed from 400 Ω to 1.4 Ωk, the above relation is changed to that indicated by the line I'.

Likewise, lines II and II' indicate cases wherein a specific current is 48 mA. The line II indicates the relation obtained when the resistance is 400 Ω and the line II' indicates the relation obtained when the resistance is 1.4 kΩ.

Lines III and III' indicate cases wherein a specific current is 24 mA. The line III indicates the relation obtained when the resistance is 400 Ω and the line III' indicates the relation obtained when the resistance is 2.0 kΩ.

Figure 16:
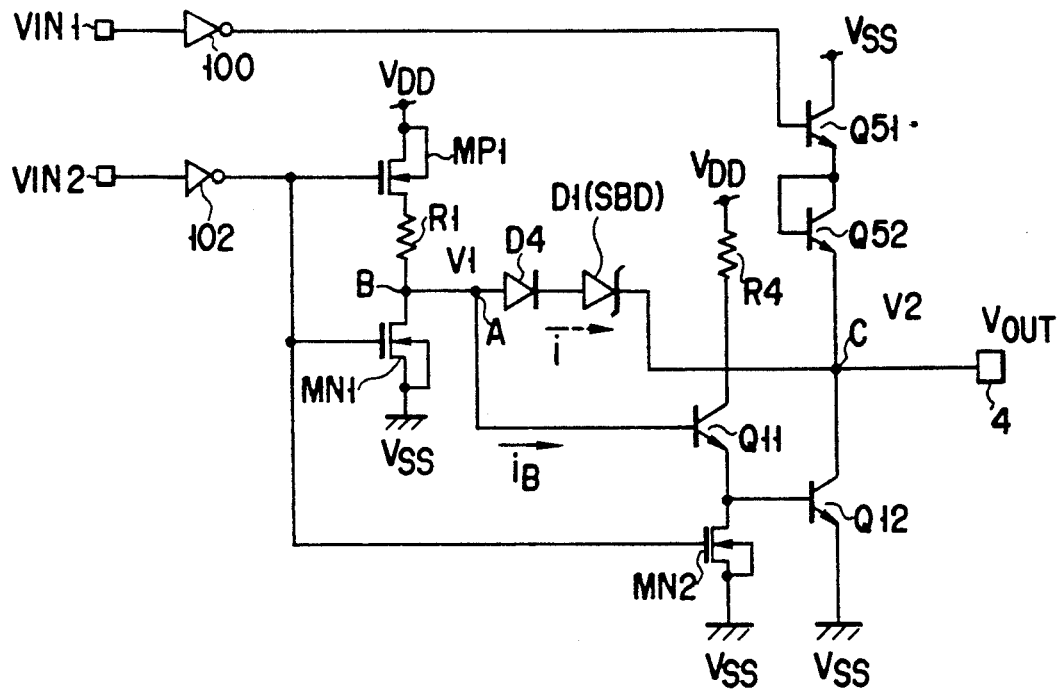
FIG. 16 is a circuit diagram of another output driver circuit whose output characteristic can be changed by means of the second current source.

The above method of controlling the output signal $V_{OUT}$ can be used not only for the devices shown in FIGS. 7, 8, 9, 11 and 12 but also for an output driver circuit shown in FIG. 16. In the output driver circuit shown in FIG. 16, a clamping circuit includes a diode D4. The diode D4 compares the potential $V_1$ of the node A and the potential $V_1$ of the node C with each other and permits a current i to flow into the output terminal 4 when ($V_1-V_2$) becomes less than a preset value.

Figure 17:
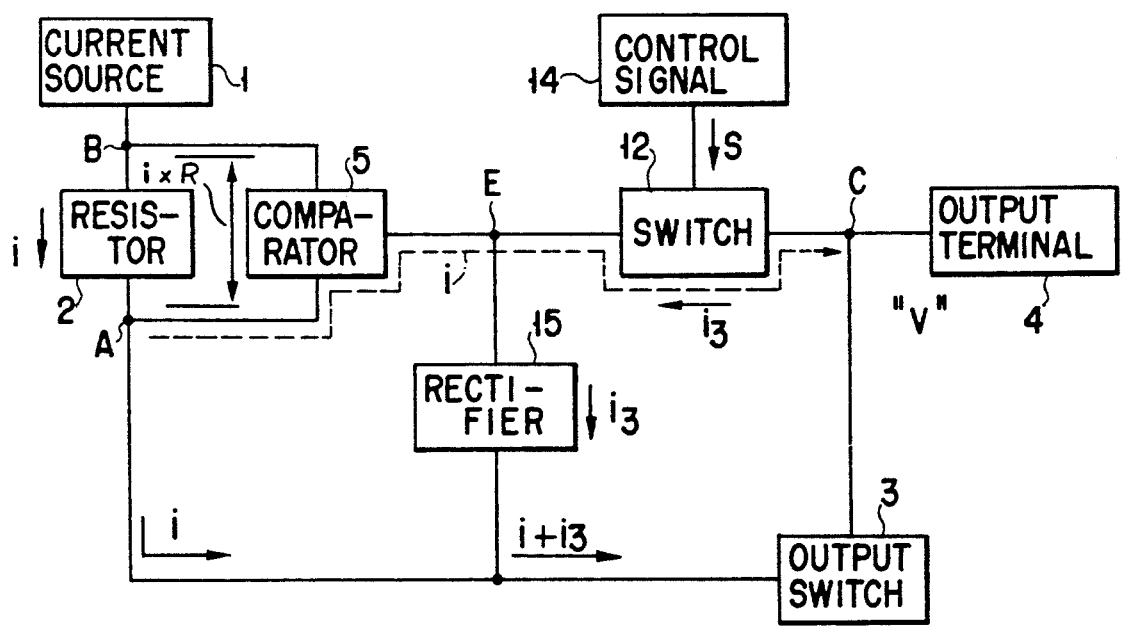
FIG. 17 is a block diagram of a clamping circuit according to a fourth embodiment of this invention.

FIG. 17 is a block diagram of a clamping circuit according to a fourth embodiment of this invention.

As shown in FIG. 17, the clamping circuit according to the fourth embodiment has a switch 12 connected between a comparator 5 and an output terminal 4. The switch 12 may permit a current to flow in both directions from the comparator 5 to the output terminal 4 and from the output terminal 4 to the comparator 5. The control end of the switch 12 is connected to a control signal generator 14. The control signal generator 14 generates a control signal S for turning on the switch 12 in synchronism with the supply of a current from a current source 1. Further, a rectifier 15 is connected between the control end of an output switch 3 and a connection node between the comparator 5 and the switch 12. The rectifier 15 may permit a current to flow only in a direction from the above connection node to the control end of the output switch 3.

In the clamping circuit of FIG. 17, the switch 12 is set in the ON state while a current i is supplied to the control end of the output switch 3. Therefore, a current i3 is supplied from the output terminal 4 to the control end of the output switch 3. As a result, an amount of current supplied to the control end of the output switch 3 becomes (i+i3) and the current driving ability of the output switch 3 can be enhanced.

The switch 12 is set in the OFF state while no current i flows, that is, while the output switch 3 is set in the OFF state. Therefore, when the output switch 3 is set in the OFF state, no reverse bias voltage is applied to the comparator 5 even if the potential of the output terminal 4 becomes high.

FIG. 18 is a circuit diagram of an output driver circuit having the clamping circuit of FIG. 17 incorporated therein.

As shown in FIG. 18, the control end of the switch 12 can be connected to a node between the current source 1 and the first input switch 7 and the first input switch 7 may also be used as the control signal generator 14.

Figure 19:
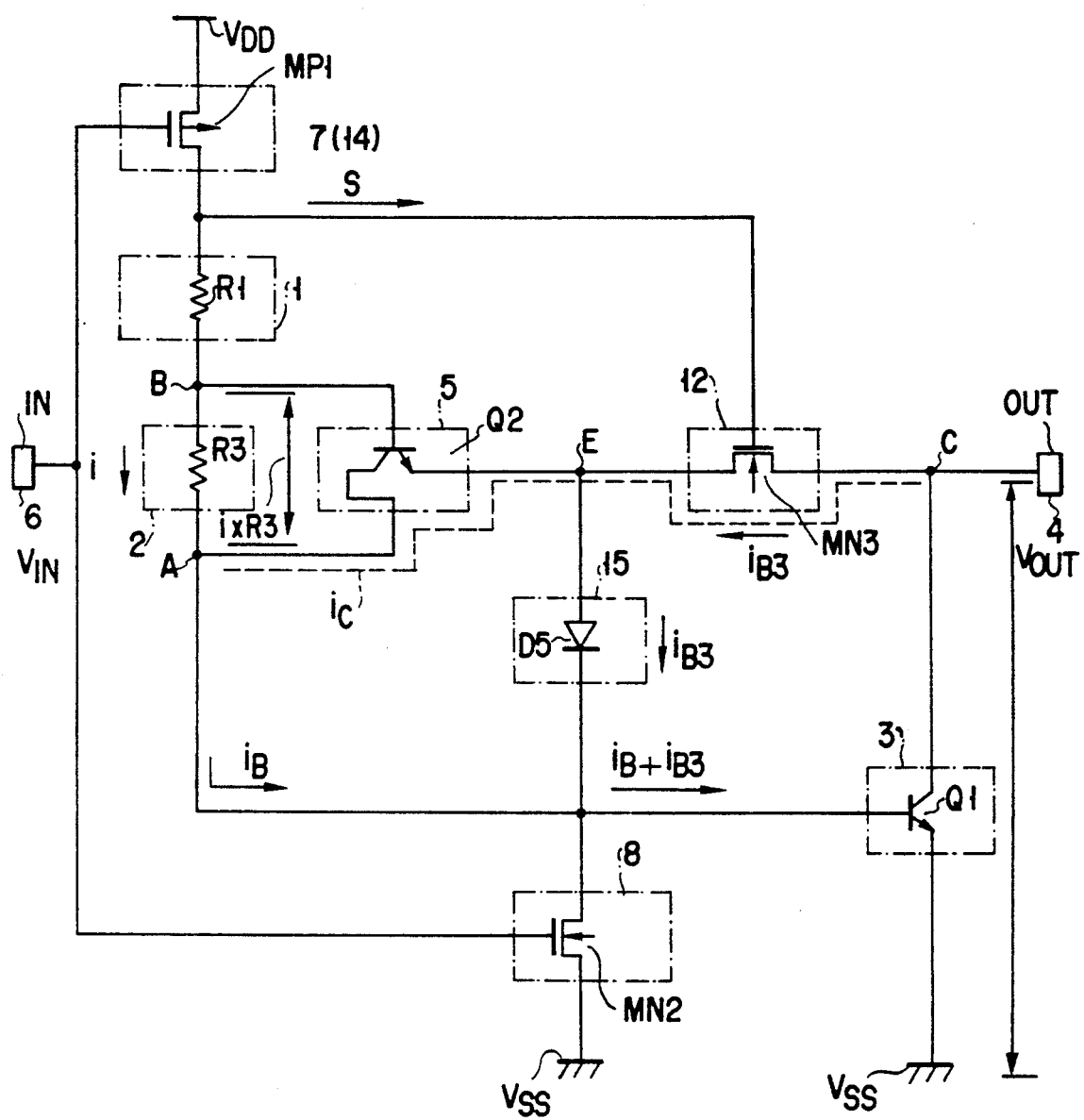
FIG. 19 is a circuit diagram of the output driver circuit shown in FIG. 18.

FIG. 19 is a circuit diagram of the clamping circuit of FIG. 18.

As shown in FIG. 19, the source of a PMOS MP1 whose gate is supplied with an input voltage $V_{IN}$ is connected to a power source $V_{DD}$ and the drain thereof is connected to the drain of an NMOS MN2 via resistors R1 and R3. The gate of the NMOS MN2 is supplied with the input voltage $V_{IN}$ and the source thereof is connected to the power source $V_{SS}$. The base of the clamping transistor Q2 is connected to a node B between the resistors R1 and R3. The collector of the transistor Q2 is connected to a node A between the resistor R3 and the base of a driver transistor Q1. The drain of the NMOS MN2 is connected to the node A and the source thereof is connected to the power source $V_{SS}$. The emitter of the transistor Q1 is connected to the power source $V_{SS}$ and the collector thereof is connected to the output terminal 4. The emitter of the transistor Q2 is connected to one end of the current path of an NMOS MN3. The other end of the current path of the NMOS MN3 is connected to a node C between the transistor Q1 and the output terminal 4. The anode of a diode D5 is connected to a node E between the transistor Q2 and the NMOS MN3 and the cathode thereof is connected to the node A.

Next, the operation of the above circuit will be explained.

When an input voltage $V_{IN}$ is set at the "H" level, the PMOS MP1 is turned off, the NMOS MN2 is turned on and the NMOS MN3 is turned off. In this case, since no base current flows into the base of the transistor Q1, the transistor Q1 is turned off and the transistor Q2 is also turned off.

At this time, even if the potential of the output terminal 4 becomes high, no reverse bias voltage will be applied between the base and the emitter of the transistor Q2 since the NMOS MN3 is turned off.

When the input voltage $V_{IN}$ is set at the "L" level, the PMOS MP1 is turned on, the NMOS MN2 is turned off and the NMOS MN3 is turned on. A current supplied from the current source 1 flows into the base of the transistor Q1 as a base current $i_B$. Further, since the NMOS MN3 is turned on, a base current $i_{B3}$ flows into the base of the transistor Q1 from the output terminal 4 via the diode D5. The current $i_{B3}$ continues to flow until the potential $V_{OUT}$ of the output terminal 4 becomes low and a voltage between the anode and cathode of the diode D5 cannot sustain the forward voltage drop.

When the potential $V_{OUT}$ of the output terminal 4 becomes lower than the potential of the node B, the transistor Q2 is turned on. Most of the current flowing from the current source 1 flows from the collector of the transistor Q2 to the emitter thereof and a current flowing into the base of the transistor Q1 is decreased. The current flowing into the emitter of the transistor 1 flows into the collector of the transistor Q1 via the current path of the NMOS MN3, thereby preventing the transistor Q1 from being set into the deep saturation state.

At this time, the anode potential of the diode D5, that is, the potential of the node E is slightly lower or slightly higher than the cathode potential so that a current flowing into the diode D5 will be approximately 0 and the influence on the base current of the transistor Q1 can be neglected.

Figure 20:
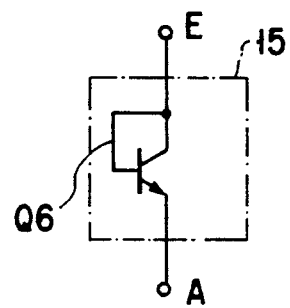
FIG. 20 is a circuit diagram showing another example of a rectifier shown in FIG. 19.

FIG. 20 is a circuit diagram showing another example of a circuit of the rectifier shown in FIG. 19.

As shown in FIG. 20, the rectifier 15 may be constructed by a bipolar transistor Q6 having the collector and base short-circuited to each other. The collector of the transistor Q6 is connected to the node E and the emitter thereof is connected to the node A.

Figure 21:
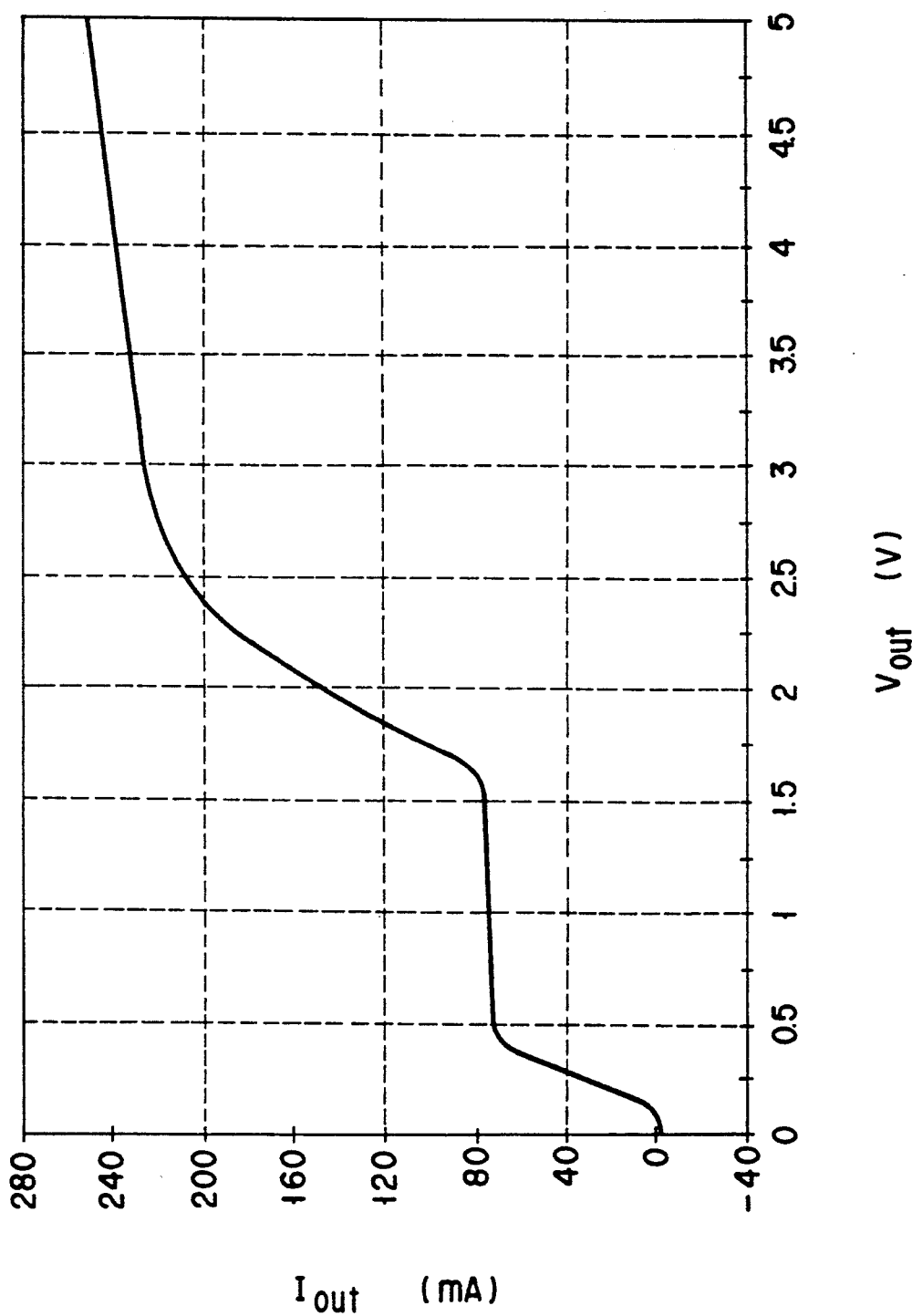
FIG. 21 is an output characteristic diagram of the output driver circuit shown in FIG. 19.

FIG. 21 is an output characteristic diagram of the output driver circuit shown in FIG. 19.

As shown in FIG. 21, when the output voltage $V_{OUT}$ is higher than or equal to 2 V, the current driving ability of the transistor Q1 is enhanced. Therefore, charges accumulated in the parasitic capacitor associated with the output terminal 4 can be rapidly discharged to effect the high-speed switching operation.

A current flowing from the output terminal 4 into the base of the transistor Q1 is caused by charges accumulated in the parasitic capacitor associated with the output terminal 4 and a current flowing from the power source $V_{DD}$ into the resistor. The current is originally derived from the collector of the transistor Q1. Therefore, the power consumption in the circuits of FIGS. 17, 18 and 19 is substantially the same as that of the circuit shown in FIG. 3, for example.

Figure 2:
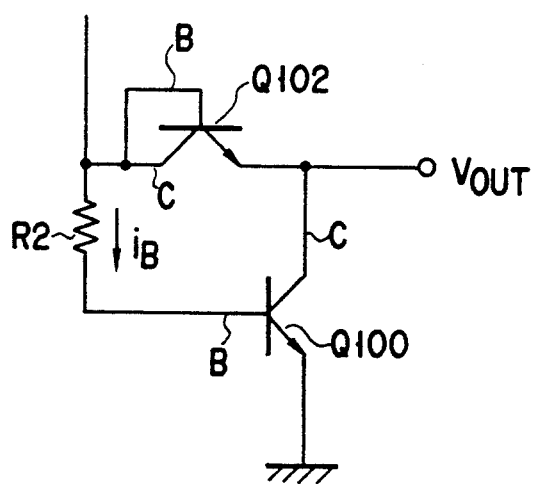
FIG. 2 is a circuit diagram of another prior art clamping circuit.

As described above, the clamping circuits explained with reference to the embodiments are operated when the output signal $V_{OUT}$ becomes equal to or less than a voltage appearing across the resistor R3 or (i×R3). Therefore, a base current flowing into the driver transistor can be made less in comparison with a base current in the clamping circuit using the silicon PN junction diode shown in FIG. 2, for example, and a satisfied clamping characteristic can be obtained and the above operation can be rapidly effected when a specified output voltage is reached.

Further, the manufacturing process can be simplified and the pattern area can be reduced in comparison with that for manufacturing the clamping circuit having the SBD shown in FIG. 1 because it is not necessary to form the SBD. Further, in the semiconductor device (gate array, for example) utilizing the master-slice method, a basic cell can be formed by use of a normal bipolar transistor having no SBD so that the manufacturing process can be simplified, the pattern area can be reduced and the delivery time of gate array or standard cell approach can be shortened. Of course, the clamping circuit of this invention can be obtained by changing the connections between normal type transistors formed in the basic cell.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
   a first power source;
   a second power source;
   an input terminal;
   an output terminal;
   an input switch having a current path, one end of which is connected to said first power source, and a control end which is connected to said input terminal;
   an output switch having a current path and a control end, one end of the current path of said output switch being connected to said second power source;

first resistor means having a current path including a resistor element, one end of the current path of said first resistor means being connected to the other end of the current path of said input switch;

second resistor means having a current path including a resistor element;

first wiring means for connecting the other end of the current path of said first resistor means and one end of the current path of said second resistor means, said first wiring means including a first node;

second wiring means for connecting the other end of the current path of said second resistor means and the control end of said output switch, said second wiring means including a second node;

third wiring means for connecting the other end of the current path of said output switch and said output terminal, said third wiring means including a third node; and comparing means for comparing a first potential difference between said first and second nodes with a second potential difference between said second and third nodes, and for permitting a current to flow from said second node to said third node when said first potential difference is greater than or equal to said second potential difference.

2. An integrated circuit according to claim 1, wherein said comparing means includes a bipolar transistor having a base connected to said first node, a collector connected to said second node and an emitter connected to said third node.

3. An integrated circuit according to claim 2, wherein said output switch includes a bipolar transistor having a base connected to the other end of the current path of said second resistor means and a collector connected to said output terminal.

4. An integrated circuit according to claim 1, wherein said comparing means includes a first bipolar transistor having a base connected to said first node and a collector connected to said second node; and a second bipolar transistor having a base connected to an emitter of said first bipolar transistor, a collector connected to the collector of said first bipolar transistor and an emitter connected to said third node.

5. A semiconductor integrated circuit comprising:

a first power source;

a second power source;

an input terminal;

an output terminal;

an input switch having a current path, one end of which is connected to said first power source, and a control end which is connected to said input terminal;

a first output switch having a current path and a control end, one end of the current path of said first output switch being connected to said second power source;

a second output switch having a current path and a control end, one end of the current path of said second output switch being connected to the control end of said first output switch;

first resistor means having a current path including a resistor element, one end of the current path of said first resistor means being connected to the other end of the current path of said input switch;

second resistor means having a current path including a resistor element;

first wiring means for connecting the other end of the current path of said first resistor means and one end of the current path of said second resistor means, and first wiring means including a first node;

second wiring means for connecting the other end of the current path of said second resistor means and the control end of said second output switch, said second wiring means including a second node;

third wiring means for connecting the other end of the current path of said first output switch and said output terminal, said third wiring means including a third node;

current limiting means for limiting a current, said current limiting means having a current path, one end of which is connected to said first power source and the other end of which is connected to the other end of the current path of said second output switch; and comparing means for comparing a first potential difference between said first and second nodes with a second potential difference between said second and third nodes, and for permitting a current to flow from said second node to said third node when said first potential difference is greater than or equal to said second potential difference.

6. An integrated circuit according to claim 1, wherein said resistor means is a passive element.

7. A semiconductor integrated circuit comprising:

a first power source;

a second power source;

an input terminal;

an output terminal;

an input switch having a current path, one end of which is connected to said first power source, and a control end which is connected to said input terminal;

a first output switch having a current path and a control end, one end of the current path of said first output switch being connected to said second power source;

a second output switch having a current path and a control end, one end of the current path of said second output switch being connected to the control end of said first output switch;

first resistor means having a current path including a resistor element, one end of the current path of said first resistor means being connected to the other end of the current path of said input switch;

second resistor means having a current path including a resistor element;

first wiring means for connecting the other end of the current path of said first resistor means and one end of the current path of said second resistor means, and first wiring means including a first node;

second wiring means for connecting the other end of the current path of said second resistor means and the control end of said second output switch, said second wiring means including a second node;

third wiring means for connecting the other end of said first output switch and said output terminal, said third wiring means including a third node;

current limiting means for limiting a current, said current limiting means having a current path, one end of which is connected to said first power source and the other end of which is connected to the other end of the current path of said second output switch;

comparing means for comparing a first potential difference between said first and second nodes with a second potential difference between said second and third nodes, and for permitting a current to flow from said second node to said third node when said first potential difference is greater than or equal to said second potential difference, said comparing means having a first terminal, a second terminal, and a third terminal, said first terminal being connected to said first node, and said second terminal being connected to said second node; and rectifier means including a current path having a first end connected to said third terminal and a second end connected to said third node, said rectifier means allowing a current to flow from said first end to said second end.

8. An integrated circuit according to claim 1, further comprising:

an additional input switch having a current path and a control end, the control end of said additional input switch being connected to said input terminal, one end of the current path of said additional input switch being connected to said second power source, the other end of the current path of said additional input switch being connected to said second node, and said additional input switch being set in the OFF state when said input switch is set in the ON state, and being set in the ON state when said input switch is set in the OFF state.

9. An integrated circuit according to claim 8, wherein said input switch includes a P-channel insulated gate type FET and said additional input switch includes an N-channel insulated gate type FET.

10. An integrated circuit according to claim 8, wherein said input switch includes an NPN transistor supplied with an inverted signal of the control signal at the control end thereof and said additional input switch includes an N-channel insulated gate type FET.

11. A semiconductor integrated circuit comprising:
a first power source;
a second power source;
an input terminal;
an output terminal;
a first switch having a current path, one end of which is connected to said first power source, and a control end which is connected to said input terminal;
a second switch having a current path and a control end, one end of the current path of said first output switch being connected to said second power source;
first resistor means having a current path including a resistor element, one end of the current path of said first resistor means being connected to the other end of the current path of said first switch;
second resistor means having a current path including a resistor element;
first wiring means for connecting the other end of the current path of said first resistor means and one end of the current path of said second resistor means, and first wiring means including a first node;
second wiring means for connecting the other end of the current path of said second resistor means and the control end of said second output switch, said second wiring means including a second node;
third wiring means for connecting the other end of the current path of said second switch and said output terminal, said third wiring means including a third node;

comparing means for comparing a first potential difference between said first and second nodes with a second potential difference between said second and third nodes, and for permitting a current to flow from said second node to said third node when said first potential difference is greater than or equal to said second potential difference, said comparing means having a first terminal, a second terminal, and a third terminal, said first terminal being connected to said first node, and said second terminal being connected to said second node;

rectifier means including a current path having a first end connected to said third terminal and a second end connected to said second node, said rectifier means allowing a current to flow from said first end to said second end; and a third switch having a current path and a control end, one end of the current path of said third switch being connected to said third node, the other end of the current path of said third switch being connected to a connection node between said third terminal and said first end of the current path of said rectifier means, and the control end of said third switch being supplied with a control signal.

12. An integrated circuit according to claim 5, wherein said comparing means includes a bipolar transistor having a base connected to said first node, a collector connected to said second node and an emitter connected to said third node.

13. An integrated circuit according to claim 5, wherein said first output switch includes a first bipolar transistor having an emitter connected to said second power source and a collector connected to said third node; and said second output switch includes a second bipolar transistor having a base connected to said second node, an emitter connected to the base of said first bipolar transistor, and a collector connected to the other end of the current path of said current limiting means.

14. An integrated circuit according to claim 5, wherein said comparing means includes a first bipolar transistor having a base connected to said first node and a collector connected to said second node; and a second bipolar transistor having a base connected to an emitter of said first bipolar transistor, a collector connected to the collector of said first bipolar transistor and an emitter connected to said third node.

15. An integrated circuit according to claim 5, wherein said current limiting means is a resistor.

16. An integrated circuit according to claim 5, wherein said first and second resistor means are passive elements.

17. An integrated circuit according to claim 15, wherein said resistor is a passive element.

18. An integrated circuit according to claim 5, further comprising:

a first additional input switch having a current path and a control end, the control end of said first additional input switch being connected to said input terminal, one end of the current path of said first additional input switch being connected to said second power source, the other end of the current path of said first additional input switch being connected to said second node, and said first additional input switch being set in the OFF state when said input switch is set in the ON state, and being set in the ON state when said input switch is set in the OFF state; and a second additional input switch having a current path and a control end, the control end of said second additional input switch being connected to said input terminal, one end of the current path of said second additional input switch being connected to said second power source, the other end of the current path of said second additional input switch being connected to a connection node between the control end of said first output switch and one end of the current path of said second output switch, and said second additional input switch being set in the OFF state when said input switch is set in the ON state, and being set in the ON state when said input switch is set in the OFF state.

19. An integrated circuit according to claim 18, wherein said input switch includes a P-channel insulated gate type FET, said first additional input switch includes an N-channel insulated gate type FET, and said second additional input switch includes an N-channel insulated gate type FET.

20. An integrated circuit according to claim 19, wherein said input switch includes an NPN transistor supplied with the inverted form of said control signal at the control end thereof, said first additional input switch includes an N-channel insulated gate type FET, and said second additional input switch includes an N-channel insulated gate type FET.

21. An integrated circuit according to claim 5, further comprising:

a first additional input switch having a current path and a control end, the control end of said first additional input switch being connected to said input terminal, one end of the current path of said first additional input switch being connected to said second power source, the other end of the current path of said first additional input switch being connected to said second node, and said first additional input switch being set in the OFF state when said input switch is set in the ON state, and being set in the ON state when said input switch is set in the OFF state;

a second additional input switch having a current path and a control end, the control end of said second additional input switch being connected to said input terminal, one end of the current path of said second additional input switch being connected to said second power source, the other end of the current path of said second additional input switch being connected to a connection node between the control end of said first output switch and one end of the current path of said second output switch, and said second additional input switch being set in the OFF state when said input switch is set in the ON state, and being set in the ON state when said input switch is set in the OFF state; and a further input terminal; and a third additional input switch having a current path and a control end, the control end of said third additional input switch being connected to said further input terminal, one end of the current path of said third additional input switch being connected to said first power source, and the other end of the current path of, and said third additional input switch being connected to said third node.

22. An integrated circuit according to claim 5, wherein an amount of current flowing in the current path of said second output switch is controlled to change an output voltage of said first output switch which receives the current therefrom at the control end by changing an amount of current supplied from said current limiting means.

23. An integrated circuit according to claim 15, wherein an amount of current flowing in the current path of said second output switch is controlled to change an output voltage of said first output switch which receives the current therefrom at the control end by changing the resistance of said resistor.

24. A semiconductor integrated circuit comprising:
a first power source;
a second power source;
an input terminal;
an output terminal;
a first switch having a current path, one end of which is connected to said first power source, and a control end which is connected to said input terminal;
a second switch having a current path and a control end, one end of the current path of said first output switch being connected to said second power source;
a third switch having a current path and a control end, one end of the current path of said third switch being connected to the control end of said second switch;
a first resistor having a current path including a resistor element, one end of the current path of said first resistor being connected to the other end of the current path of said first switch;
second resistor means having a current path including a resistor element;
first wiring means for connecting the other end of the current path of said first resistor means and one end of the current path of said second resistor, said first wiring means including a first node;
second wiring means for connecting the other end of the current path of said second resistor means and the control end of said third switch;
third wiring means for connecting the other end of the current path of said second switch and said output terminal, said third wiring means including a second node;
current limiting means for limiting a current, said current limiting means having a current path, one end of which is connected to said first power source and the other end of which is connected to the other end of the current path of said third switch; and
a rectifier for permitting a current to flow from said first node to said second node when a difference between a first potential of said first node and a second potential of said second node is equal to or less than a predetermined value;
wherein output characteristics of said second switch are controlled by adjusting the degree to which the current is limited by said current limiting means.

25. An integrated circuit according to claim 7, wherein said rectifier means is a bipolar transistor whose collector and base are commonly connected to said third terminal and whose emitter is connected to said third node.

26. An integrated circuit according to claim 7, wherein said rectifier means is a bipolar transistor whose collector and base are commonly connected to said third node and whose emitter is connected to said output terminal.

27. An integrated circuit according to claim 11, wherein said third switch is an insulated gate type FET having one of the source and drain as said one end, the other of said source and drain as said other end and a gate as said control end.

28. An integrated circuit according to claim 11, wherein said rectifier means is a diode having an anode connected to said third terminal and a cathode connected to said second node.

29. An integrated circuit according to claim 11, wherein said rectifier means is a bipolar transistor whose collector and base are commonly connected to said third terminal and whose emitter is connected to said second node.

30. An integrated circuit according to claim 11, wherein said comparing means is bipolar transistor having a base connected to said first node, a collector connected to said second node, and an emitter connected to said third node.

31. An integrated circuit according to claim 30, wherein said second switch is a bipolar transistor having a base connected to said second node and a collector connected to said third node, and an emitter connected to said second power source.

32. An integrated circuit according to claim 11, wherein said first and second resistor means are passive elements.

33. An integrated circuit according to claim 11, further comprising:

a fourth switch having a current path and a control end, the control end of said fourth switch being connected to said input terminal, one end of the current path of said fourth switch being connected to said second power source, the other end of the current path of said fourth switch being connected to said second node, and said fourth switch being set in the OFF state when said first switch is set in the ON state, and being set in the ON state when said first switch is set in the OFF state.

34. An integrated circuit according to claim 33, wherein the control end of said third switch is connected to a connection node between one end of the current path of said first resistor means and the other end of the current path of said first switch, and receives the control signal from said other end of the current path of said first switch.

35. An integrated circuit according to claim 34, wherein said first switch is a P-channel insulated gate type FET and said fourth switch is an N-channel insulated gate type FET.

36. An integrated circuit according to claim 6, wherein said passive elements are of the same type.

37. An integrated circuit according to claim 16, wherein said passive elements are of the same type.

38. An integrated circuit according to claim 7, wherein said first and second resistor means are passive elements of the same type.

39. An integrated circuit according to claim 32, wherein said passive elements are of the same type.

* * * * *

UNITED STATES PATENT AND TRADEMARK OFFICE
CERTIFICATE OF CORRECTION

PATENT NO. : 5,239,216  Page 1 of 2
DATED : August 24, 1993
INVENTOR(S) : Toshikazu Sei et al.

It is certified that error appears in the above-indentified patent and that said Letters Patent is hereby corrected as shown below:

Claim 7, column 14, line 55, change "and" to --said--.

Claim 11, column 15, line 48, change "first output" to --second--.

Claim 11, column 15, line 63, delete "output".

Claim 24, column 18, line 23, change "first output" to --second--.

Claim 24, column 18, line 34, before "second" insert --a--.

Claim 24, column 18, line 37, delete "means".

UNITED STATES PATENT AND TRADEMARK OFFICE
CERTIFICATE OF CORRECTION

PATENT NO. : 5,239,216
DATED : August 24, 1993
INVENTOR(S) : Toshikazu Sei et al.

It is certified that error appears in the above-indentified patent and that said Letters Patent is hereby corrected as shown below:

Claim 24, column 18, line 41, delete "means".

Signed and Sealed this

First Day of November, 1994

Attest:

BRUCE LEHMAN

Attesting Officer     Commissioner of Patents and Trademarks